HIGH INPUT IMPEDANCE DIRECT-COUPLED TRANSISTOR AMPLIFIER INCLUDING NEGATIVE-FEEDBACK MEANS

Filed Sept. 27, 1963

United States Patent Office 3,260,949

Patented July 12, 1966

3,260,949

HIGH INPUT IMPEDANCE DIRECT-COUPLED TRANSISTOR AMPLIFIER INCLUDING NEGATIVE-FEEDBACK MEANS

Ernst W. Voorhoeve, Ambler, Pa., assignor to Leeds and Northrup Company, Philadelphia, Pa., a corporation of Pennsylvania Filed Sept. 27, 1963, Ser. No. 312,151

3 Claims. (Cl. 330—19)

This invention relates to solid-state multi-stage A.C. amplifiers and particularly relates to circuitry which provides both for high impedance input of the amplifier in the audio-frequency range and for stabilization of the D.C. operating points of its transistors or equivalent solid-state devices.

In accordance with the present invention, the transistors of the successive stages of the amplifier are conductively coupled, emitter-to-base, and the emitter circuit of the final stage transistor includes a conductive output circuit impedance. The collector of the transistor of one stage, preferably the first, is operated at a substantially fixed D.C. potential and the base of that transistor is resistively connected to the collector of a second transistor, preferably that of the last or output stage. The collector of the second transistor operates at a varying D.C. potential because the collector is connected via conductive impedance means of substantial resistance to the D.C. supply source. With the transistors so connected and the circuit parameters properly correlated, the input impedance of the amplifier is of the order of megohms in the audio-frequency range, so minimizing loading of the source of A.C. signals and the D.C. operating points of all of the transistors are temperature-stabilized to maintain substantial constancy of the A.C. signal gain despite change of environ temperature.

The invention further resides in solid-state amplifiers having features of novelty and utility hereinafter described and claimed.

Figure 1:
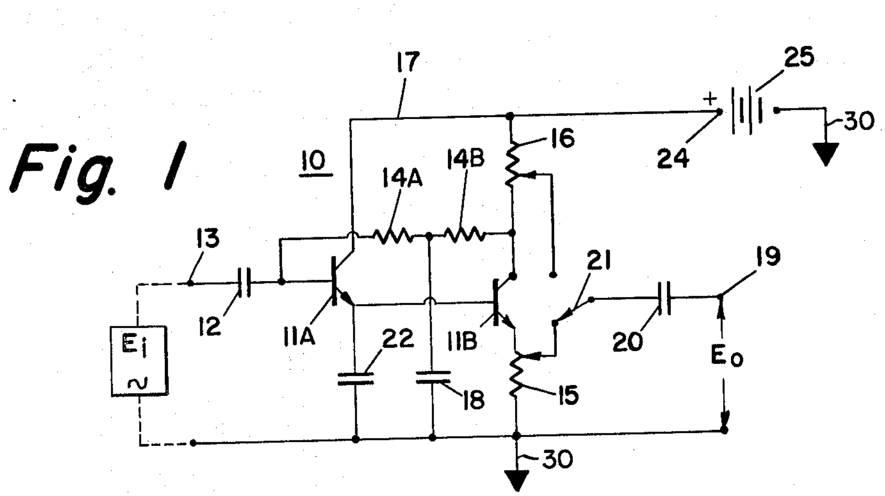
Figures 2, 3:
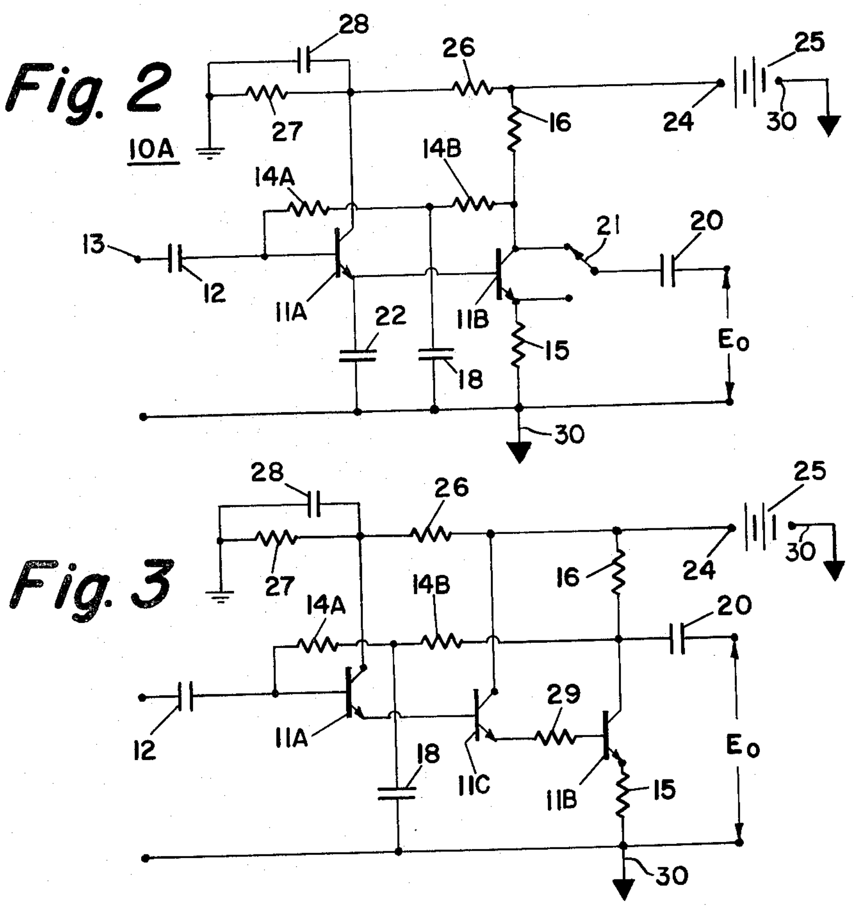

For a more detailed understanding of the invention, reference is made to the accompanying description of the attached drawings, in which:

FIG. 1 schematically illustrates a two-stage amplifier embodying the invention;

FIG. 2 is a modification of the two-stage amplifier of FIG. 1; and

FIG. 3 schematically illustrates a three-stage amplifier incorporating the invention.

Referring to FIG. 1, the two-stage amplifier 10 comprises transistors 11A, 11B of like type: i.e., both transistors may be, as illustrated, of the NPN type, or both may be of the PNP type. In the latter case, the poling of the current supply source 25 should be reversed from that shown in FIG. 1. The base of the first stage, or input transistor 11A, so far as D.C. is concerned, is non-conductively coupled via blocking capacitor 12 to the ungrounded signal input terminal 13 of the amplifier and is resistively coupled via the resistance means 14A, 14B of a negative feedback circuit to the collector of the second stage, or output, transistor 11B. The collector of transistor 11B is connected via resistor 16 to ungrounded terminal 24 of the D.C. current source 25. The collector of transistor 11A is connected directly to the supply terminal 24 as by conductor 17 in a path which does not include the collector circuit resistor 16 of transistor 11B. The emitter of transistor 11A is directly coupled to the base of transistor 11B and has no conductive connection to ground point 30 so that the sum of the base and collector currents of transistor 11A provides the base current of transistor 11B. The emitter of the output transistor 11B is conductively coupled by resistor 15, or other conductive impedance, to the common or chassis ground terminal 30 of the D.C. current source 25 and so is traversed by direct current equal to the value of the sum of the collector current of transistor 11B, the collector current of transistor 11A and the base current of transistor 11A. The only D.C. path from the emitters of transistors 11A, 11B to ground point 30 is that afforded by the conductive impedance 15 which, not being shunted by any bypass capacitor, is included in both the A.C. input circuit and the A.C. output circuit of the amplifier.

With the circuitry described, both high point impedance of the amplifier and effective temperature-stabilization of the D.C. operating points of its transistors are attained by proper correlation of the resistance values of the circuit elements 14A, 14B, 15 and 16. The realization and maintenance of high input impedance of the amplifier minimizes loading effects upon the source of the A.C. input signal $E_1$ and stabilization of the D.C. operating points of the transistors maintains substantial constancy of the A.C. output signal $E_0$ as appearing between ground and either the emitter or collector of the output transistor 11B for a given input signal. Although the basic circuit of FIG. 1 is not limited to such application, the specific examples below given are for an amplifier whose input signal source is of high impedance and whose signal level, when a balanceable network is involved, may be as low as a few millivolts or less. The basic circuit has been incorporated in a Null Balance Detector made by Leeds and Northrup Company, Catalog No. 353,290.

In general, the low-frequency input impedance of the amplifier 10, as appearing between the base of input transistor 11A and ground 30, is equal to $\beta_1\beta_2R_4$ shunted by $R_1+R_2$ where $\beta_1\beta_2$ are the low-frequency gains of transistors 11A, 11B and $R_4$, $R_1$, $R_2$ are the resistance values of resistors 15, 14A, 14B respectively. Thus it would appear, other factors remaining fixed, that the input impedance of the amplifier would become higher and higher for increasingly higher values of the emitter circuit resistance 15 because of increased value of the product term $\beta_1\beta_2R_4$. It would also appear, other factors remaining fixed, that the input impedance of the amplifier would become higher and higher for increasingly higher values of resistors 14A, 14B because of the decreased shunting effect of the sum term $R_1+R_2$. However, the values chosen for these resistors must be so correlated to each other and also to the value of resistor 16 that the transistors continue to function as amplifiers and operate at a substantially fixed point of their base-current/collector-current characteristics despite temperature variations (due to load current and/or change in ambient temperature) and/or substitution of transistors of supposedly similar characteristics but whose $\beta$ may vary as much as a 3 to 1 range. To that end, the sume of the values of resistors 14A, 14B (i.e., $R_1+R_2$) must be large compared to the value of either the resistor 15 or 16 and the value of resistor 16 should be of the same order or substantially higher than the value of resistor 15. When the resistor 14B is bypassed from the signal frequency by capacitor 18, its value is omitted from the sum $R_1+R_2$ so far as input impedance is concerned, but is retained in that sum so far as stabilization of the D.C. operating points of the transistors is concerned. Two specific examples of circuit parameters affording high A.C. input impedance and good temperature-stabilization of the D.C. operating points are given below.

*Example I.—Input-impedance: 1 megohm at 60 cycles*

| | |
|---|---|
| Transistor **11A** | Type 2N-1418. |
| Transistor **11B** | Do. |
| Resistor **14A** | 1.2 megohms. |
| Resistor **14B** | 1 megohm. |
| Resistor **15** | 390 ohms. |
| Resistor **16** | 5 kilo-ohms. |

| | |
|---|---|
| Capacitor 12 | .05 microfarad. |
| Capacitor 18 | Do. |
| Capacitor 20 | 10 microfarads. |
| Source 25 | 15 volts (nominal). |

*Example II.—Input-impedance: 20–40 megohms at 60 cycles*

| | |
|---|---|
| Transistor 11A | Type 2N–2712. |
| Transistor 11B | Do. |
| Resistor 14A | 82 megohms. |
| Resistor 14B | 1 megohm. |
| Resistor 15 | 8.2 kilo-ohms. |
| Resistor 16 | 10 kilo-ohms. |
| Capacitor 12 | .001 microfarad. |
| Capacitor 18 | .05 microfarad. |
| Capacitor 20 | 10 microfarads. |
| Capacitor 22 | .0005 microfarad. |
| Source 25 | 25 volts (nominal). |

For both examples, good reproducibility of input circuit impedance and of temperature-stabilization were obtained with a substantial number of randomly sampled transistors of given type and over a temperature range extending from about 25° C. to 65° C. In Example II, the transistors were high-gain planar transistors. With them, an amplifier input impedance of over 20 megohms was obtained with an output noise level of less than 2 millivolts peak-to peak. An additional small capacitor 22 connected between the emitter of the input transistor 11*a* and ground or chassis lowers the input impedance of the amplifier for high-frequency noise.

It is to be noted that in FIG. 1 the D.C. operating potential of the input transistor 11A is of fixed value corresponding to that of terminal 24 of the supply source 25 whereas the collector of the output transistor 11B operates at a lower and varying D.C. potential dependent upon the voltage drop across resistor 16 due to flow therethrough of the sum of the collector current of output transistor 11B and the base current of input transistor 11A. When the voltage of the current supply source 25 is substantially higher than in the example above given, the noise level output of the amplifier may be reduced by using additional circuitry shown in FIG. 2.

In the modification of FIG. 2, the collector voltage of the input transistor 11A, as derived from the potential-divider circuit comprising resistors 26, 27 connected between terminal 24 of the supply source and ground, is substantially constant and is independent of the collector voltage of the output transistor 11B. The operation of input transistor 11A at lower collector voltage reduces the noise level of the input stage. The capacitor 28 bypasses the resistor 27; in consequence, so far as the signal frequency is concerned, the collector of the input transistor 11A is at ground potential. Suitable values for these additional components are:

| | | |
|---|---|---|
| Resistor 26 | kilo-ohms | 100 |
| Resistor 27 | do | 50 |
| Capacitor 28 | microfarad | 0.5 |

In other respects, the remainder of the circuitry of FIG. 2 is essentially the same as that of FIG. 1 and need not be again described.

The invention is not limited to a two-stage amplifier; one or more additional stages with the emitter of one stage conductively coupled to the base of the next higher stage may be used to increase the product term ($\beta_1\beta_2 \ldots R_4$) of the input circuit impedance and the D.C. operating point of all resistors will be temperature-stabilized by the single D.C. feedback path afforded by resistors 14A, 14B from the base of the input transistor to the collector of the last stage transistor which is connected to the supply source through a voltage-dropping resistor 16. For example, in the three-stage amplifier 10B of FIG. 3, the transistor 11C is interposed between the input and output stages with its base connected to the emitter of input transistor 11A and its emitter connected via resistor 29 to the base of the output transistor 11B. The base of the input transistor 11A is connected via the resistance means 14A, 14B to the collector of output transistor 11B. In this case, the input impedance of the amplifier is approximately equal to $\beta_1\beta_2\beta_3R_4$ (where $\beta_3$ is the signal frequency gain of the additional transistor 11C) shunted by the effective impedance of the resistance means 14A, 14B. The collector voltage of the input transistor 11A may be derived, as in FIG. 2, from the potential-divider network 26, 27. The collector of the interposed transistor 11C may be connected directly to the ungrounded terminal 24 of source 25.

What is claimed is:

1. A transistor-type A.C. amplifier having at least two stages and supplied from a D.C. source having grounded and ungrounded terminals of opposite polarity characterized in that
   - the transistors of successive stages are conductively coupled in emitter-to-base configuration with the emitters of all transistors except that of the final stage having no D.C. connection to said grounded terminal;
   - the emitter of the final-stage transistor is connected to said grounded terminal solely by an unbypassed first resistance means which is traversed by the total D.C. emitter current of all stages and is common to the A.C. input and A.C. output circuits of the amplifier;
   - the collector of each transistor except that of the final stage is connected to a point of fixed D.C. reference potential with respect to said grounded terminal;
   - the collector of the final-stage transistor is connected to said ungrounded terminal of the D.C. source by a second resistance means and to the base of the input-stage transistor by third resistance means of a feedback circuit;
   - for temperature-stabilization of the D.C. operating points of all transistors and high input-impedance of the amplifier,
     - (a) the resistance value of said second resistance means is of the same or high order relative to said first resistance means, and
     - (b) the resistance value of said third resistance means is of the order of megohms and great relative to the resistance values of said first and second resistance means.

2. An A.C. amplifier according to claim 1 additionally including
   - a potential-divider comprising fourth and fifth resistance means respectively connected from the collector of the input-stage transistor to said grounded and ungrounded terminals of the D.C. source, and
   - capacitance means shunting said fourth resistance means to bypass signal-frequencies while maintaining said collector at fixed D.C. reference potential determined by said potential-divider.

3. An A.C. amplifier according to claim 1 in which
   - the emitter of the first-stage transistor is connected to said grounded teminal solely by small capacitance means effective to lower the input-impedance of the amplifier for high-frequency noise.

References Cited by the Examiner

UNITED STATES PATENTS

| | | | |
|---|---|---|---|
| 2,663,830 | 12/1953 | Oliver | 330—19 X |
| 2,995,712 | 8/1961 | Montgomery | 330—19 |
| 3,075,151 | 1/1963 | Murray | 330—20 |

FOREIGN PATENTS

| | | |
|---|---|---|
| 882,294 | 12/1961 | Great Britain. |

NATHAN KAUFMAN, *Primary Examiner.*

F. D. PARIS *Assistant Examiner.*